(12) United States Patent
Harada (10) Patent No.: US 11,152,591 B2
(45) Date of Patent: Oct. 19, 2021

(54) METHOD FOR MANUFACTURING LIGHT-EMITTING DEVICE, AND LIGHT-EMITTING DEVICE

(71) Applicant: PIONEER CORPORATION, Tokyo (JP)

(72) Inventor: Chihiro Harada, Tokyo (JP)

(73) Assignee: PIONEER CORPORATION, Tokyo (JP)

( * ) Notice: Subject to any disclaimer, the term of this patent is extended or adjusted under 35 U.S.C. 154(b) by 90 days.

(21) Appl. No.: 16/603,102

(22) PCT Filed: Apr. 3, 2018

(86) PCT No.: PCT/JP2018/014208
§ 371 (c)(1),
(2) Date: Oct. 4, 2019

(87) PCT Pub. No.: WO2018/186377
PCT Pub. Date: Oct. 11, 2018

(65) Prior Publication Data
US 2020/0075888 A1    Mar. 5, 2020

(30) Foreign Application Priority Data
Apr. 4, 2017  (JP) .............................. JP2017-074711

(51) Int. Cl.
*H01L 21/00* (2006.01)
*H01L 51/52* (2006.01)
*H01L 51/56* (2006.01)

(52) U.S. Cl.
CPC .......... *H01L 51/5246* (2013.01); *H01L 51/56* (2013.01)

(58) Field of Classification Search
CPC ............................ H01L 51/5246; H01L 51/56
See application file for complete search history.

(56) References Cited

U.S. PATENT DOCUMENTS

| 8,963,144 B2 | 2/2015 | Sakaguchi |
| 9,269,928 B2 | 2/2016 | Sakaguchi |

(Continued)

FOREIGN PATENT DOCUMENTS

| JP | 2005-077902 A | 3/2005 |
| JP | 2010-092710 A | 4/2010 |

(Continued)

OTHER PUBLICATIONS

International Search Report for related International Application No. PCT/JP2018/014208, dated Jul. 10, 2018; 2 pages.

*Primary Examiner* — Richard A Booth
(74) *Attorney, Agent, or Firm* — Procopio, Cory, Hargreaves & Savitch LLP (57) ABSTRACT

A sealing member (200) is a sheet-like member to seal a light-emitting unit of a light-emitting device. The sealing member (200) is cut into a shape including a corner (220) having a central angle θ that is larger than 180 degrees when the light-emitting unit of the light-emitting device is sealed. When the sealing member (200) is cut, irregularities occur in the thickness direction in a region (222: first region) having a predetermined width w from an edge of the corner (220). When the irregularities occur, sealability of the sealing member (200) is deteriorated. Here, when a curvature radius of the corner ((220)) is equal to or greater than the above-mentioned width w, occurrence of the above-mentioned irregularities is inhibited.

20 Claims, 10 Drawing Sheets

(56) References Cited

U.S. PATENT DOCUMENTS

| | | |
|---|---|---|
| 9,537,114 B2 | 1/2017 | Sakaguchi |
| 9,755,166 B2 | 9/2017 | Iwagaki et al. |
| 2010/0033407 A1* | 2/2010 | Harada ............... H01L 51/0558 345/76 |
| 2010/0090204 A1* | 4/2010 | Chuman ............. H01L 51/0545 257/40 |
| 2014/0014939 A1 | 1/2014 | Sakaguchi |
| 2015/0125977 A1 | 5/2015 | Sakaguchi |
| 2015/0280152 A1 | 10/2015 | Iwagaki et al. |
| 2016/0049608 A1 | 2/2016 | Hack et al. |
| 2016/0126492 A1 | 5/2016 | Kyoung |
| 2016/0126508 A1 | 5/2016 | Sakaguchi |
| 2016/0247981 A1 | 8/2016 | Yang et al. |

FOREIGN PATENT DOCUMENTS

| | | |
|---|---|---|
| JP | 2013-164935 A | 8/2013 |
| JP | 2015122318 A | 7/2015 |
| JP | 2016-026376 A | 2/2016 |
| JP | 2016-149205 A | 8/2016 |
| WO | 2014/065169 A1 | 5/2014 |

* cited by examiner

METHOD FOR MANUFACTURING LIGHT-EMITTING DEVICE, AND LIGHT-EMITTING DEVICE

CROSS-REFERENCE TO RELATED APPLICATIONS

This application is a U.S. National Stage entry of PCT Application No: PCT/JP2018/014208 filed Apr. 3, 2018, which claims priority to Japanese Patent Application No. 2017-074711, filed Apr. 4, 2017, the contents of which are incorporated herein by reference.

TECHNICAL FIELD

The present invention relates to a method for manufacturing a light-emitting device, and a light-emitting device.

BACKGROUND ART

One example of light-emitting devices such as illumination, displays, or the like is a device which utilizes organic EL. Currently, studies are being conducted for making the planar shape of a light-emitting device using organic EL into various shapes. For example, Patent Document 1 describes providing a notch or a cut in a side edge of a substrate.

On the other hand, since an organic material is utilized in a light-emitting layer of the organic EL, in order to provide the organic EL with durability, a light-emitting unit needs to be sealed. Patent Document 2 discloses a structure utilizing a barrier layer formed of an inorganic material as the structure to seal the light-emitting unit. Further, Patent Document 2 describes forming the barrier layer on the substrate and performing cutting into a predetermined shape by punching.

RELATED ART DOCUMENT

Patent Document

[Patent Document 1]: WO 2014/065169
[Patent Document 2]: Japanese Unexamined Patent Application Publication No. 2013-164935

SUMMARY OF THE INVENTION

Among structures to seal a light-emitting unit, there is a structure in which a sheet-like sealing member prepared in advance is attached on an organic EL. Meanwhile, there is a case where making a light-emitting device into a shape including a corner having a central angle that is larger than 180 degrees is desired. In such a case, the sheet-like sealing member needs to be machined in advance into the shape including a corner having a central angle that is larger than 180 degrees. However, there is a risk that sealability of the sealing member is deteriorated during the machining step.

An example of the problem to be solved by the present invention is to prevent sealability of a sealing member from decreasing in a case where a sheet-like sealing member is machined in advance into a shape including a corner having a central angle that is larger than 180 degrees.

The invention described in claim 1 is a method for manufacturing a light-emitting device including:
preparing a sheet-like sealing member used in the light-emitting device; and
cutting the sealing member into a predetermined shape including a corner having a central angle that is larger than 180 degrees,
in which in the step of cutting the sealing member,
irregularities occur in a thickness direction in a first region having a predetermined width from an edge of the corner, and
a curvature radius of the corner is set equal to or greater than the predetermined width.

The invention described in claim 6 is a light-emitting device including:
an organic EL element; and
a sealing member sealing the organic EL element,
in which the sealing member includes:
a predetermined shape including a corner having a central angle that is larger than 180 degrees; and
irregularities in a thickness direction in a region having a predetermined width from an edge of the corner,
a curvature radius of the corner being equal to or greater than the predetermined width.

The invention described in claim 7 is a light-emitting device including:
an organic EL element; and
a sealing member sealing the organic EL element,
in which the sealing member includes a predetermined shape including a corner having a central angle that is larger than 180 degrees, a curvature radius of the corner being equal to or greater than 100 μm.

BRIEF DESCRIPTION OF THE DRAWINGS

The objects described above, and other objects, features and advantages are further made apparent by suitable embodiments that will be described below and the following accompanying drawings.

DESCRIPTION OF EMBODIMENTS

Embodiments of the present invention will be described below by referring to the drawings. Moreover, in all the drawings, the same constituent elements are given the same reference numerals, and descriptions thereof will not be repeated. Meanwhile, a corner does not necessarily need to be an acute angle in the embodiment and later-described examples. In addition, the corner may be defined as, for example, a portion having a visible outline having an angle which is changed greater than 180 degrees. Further, there is a case where a vertex of an angle is not fixed to a point but has a certain length. In addition, in the corner, the visible outline may gradually change, or may have a shape similar to the lower base and two legs of a trapezoid (provided, the lower base is shorter than the upper base). In addition, the visible outline may be irregular and extended.

Figure 1:
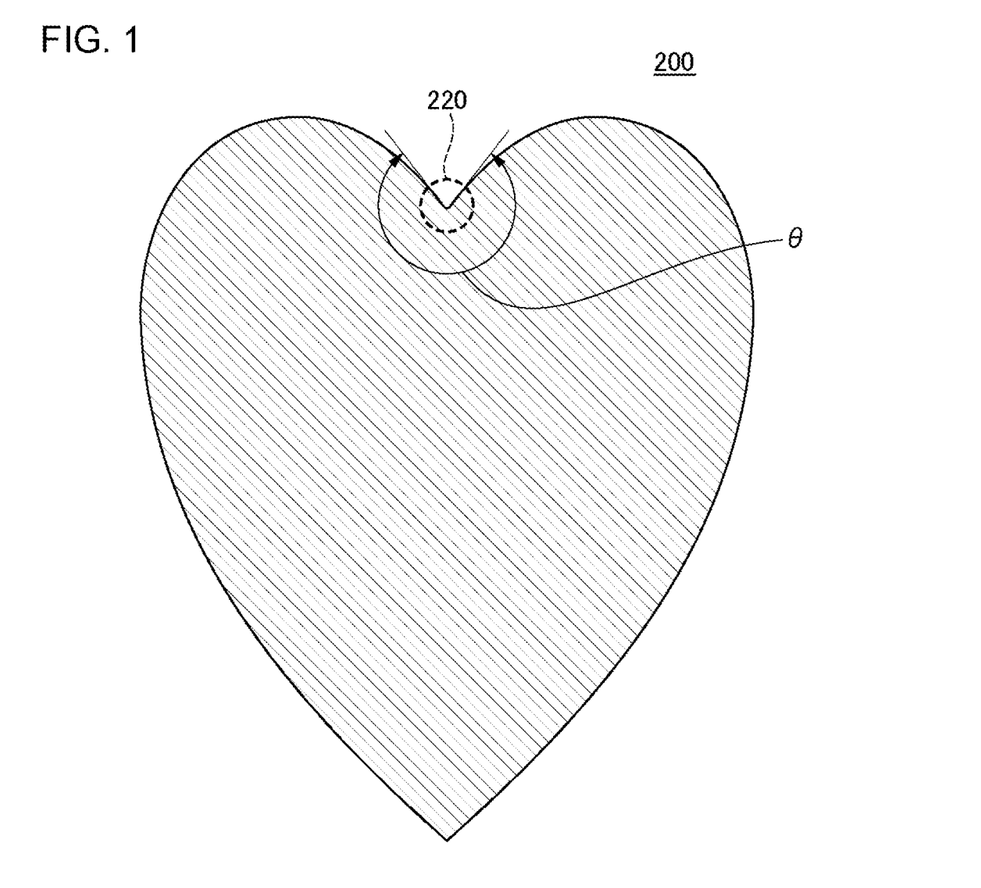
FIG. 1 is a plan view of a shape of a sealing member according to an embodiment.
Figure 2:
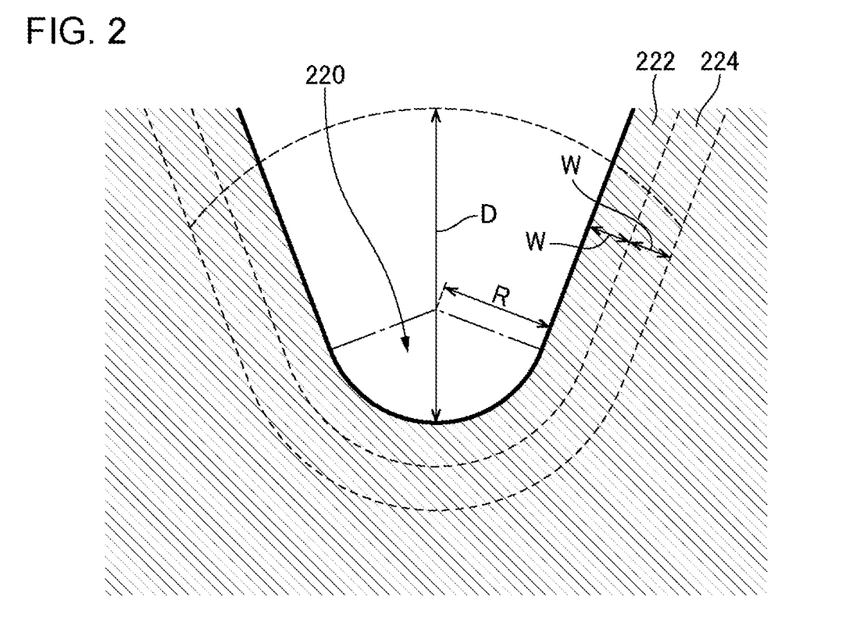
FIG. 2 is an enlarged view of a corner of a sealing member.

FIG. 1 is a plan view of the shape of a sealing member 200 according to an embodiment. FIG. 2 is an enlarged view of a corner 220 of the sealing member 200. The corner 220 is, for example as shown in FIG. 2, a portion which is located within a distance D from the vertex of the corner. D is, for example, 1 mm. The sealing member 200 is a sheet-like member to seal a light-emitting unit of a light-emitting device. The sealing member 200 is cut into a shape including a corner 220 having a central angle θ that is larger than 180 degrees when sealing the light-emitting unit of the light-emitting device. When the sealing member 200 is cut, a warp or deformation occurs in a thickness direction in a region 222 (first region) having a predetermined width w from an edge of the corner 220. When this warp or deformation occurs, sealability of the sealing member 200 is deteriorated. In contrast, as a result of the studies conducted by the inventor, irregularities caused by a warp or deformation described above can be inhibited by making the curvature radius of the corner 220 to be equal to or greater than the above-mentioned width w. Meanwhile, in the present embodiment and later-described examples, a central angle of the corner is defined as an angle formed between two tangents at the angle. A detailed description will be provided below.

Figure 3:
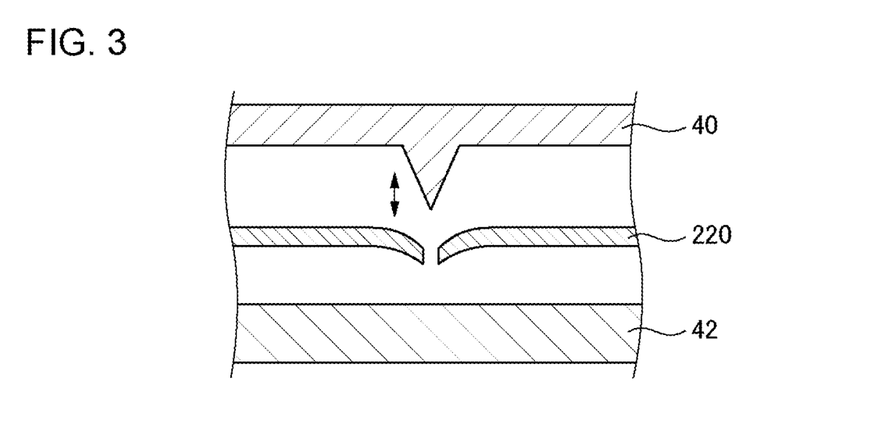
FIG. 3 is a cross-sectional view to explain a method for cutting out a sealing member.

The sealing member 200 is, for example, a film formed of a metal such as aluminum or the like (hereinafter, described as a metal film), and the thickness thereof is, for example, equal to or greater than 1 μm and equal to or less than 500 μm. As shown in FIG. 3, the sealing member 200 is cut into a predetermined shape, for example, by a punching method using a cutting blade 40 and a mat 42, a punching method using a mold, or by moving a blade along a desired line. Meanwhile, the sealing member 200 may be a resin plate or a resin film having a barrier layer on at least one surface thereof.

In a case where the sealing member 200 is a metal film, sealability of the sealing member 200 is high. However, since the sealing member 200 has ductility to a certain degree, a warp or deformation is easily formed in the height direction in the vicinity of an edge formed by cutting. The height of the warp or deformation is, for example, equal to or greater than 100 μm and equal to or less than 500 μm, and in more detail, equal to or greater than 100 μm and equal to or less than 300 μm. After punching, the sealing member 200 is planarized since a warp or deformation deteriorates sealability. However, particularly in a corner 220 including a central angle that is larger than 180 degrees, it has been found that a warp or deformation cannot be sufficiently planarized and tends to remain as irregularities.

As shown in FIG. 2 which is the enlarged view, a stress is applied to a cut portion by punching in the vicinity of the edge formed by cutting, and a warp or deformation described above is formed in the region 222 having the width w from the edge. At this time, when the sealing member is a metal, there is a case where the cut portion is stretched out due to ductility. When a curvature radius R of the tip of the corner 220 is small, even when the warp or deformation of the corner 220 is planarized, the warp or deformation remains as irregularities at the tip of the corner 220. This is because there is no spatial space at the tip of the corner 220 to restore the sealing member which was stretched with the warp. In other words, when the curvature radius R is small, the influence of the stress applied during cutting is concentrated at the tip of the corner 220. As a result of the studies conducted by the inventor, it became clear that occurrence of the above-mentioned irregularities can be inhibited when the curvature radius R is equal to or greater than the width w. In this case, deterioration in sealability of the sealing member 200 can be inhibited. Meanwhile, the width w is, for example, 100 μm. In addition, when the sealing member is a resin plate or a resin film, a crack may occur in addition to the warp or deformation. As a result of the studies conducted by the inventor, it became clear that occurrence of a crack in addition to the above-mentioned occurrence of the irregularities can be inhibited when the curvature radius R is equal to or greater than the width w.

Meanwhile, there is also a method for cutting the sealing member 200 in a predetermined shape using a laser. In this case also, irregularities may occur in the thickness direction due to alteration in the cut portion. The cause of the occurrence of alteration by laser machining is considered to be due to thermal stress. Also, in the case where laser machining is performed, the curvature radius R is desired to be equal to or greater than the width w.

EXAMPLE 1

Figure 4:
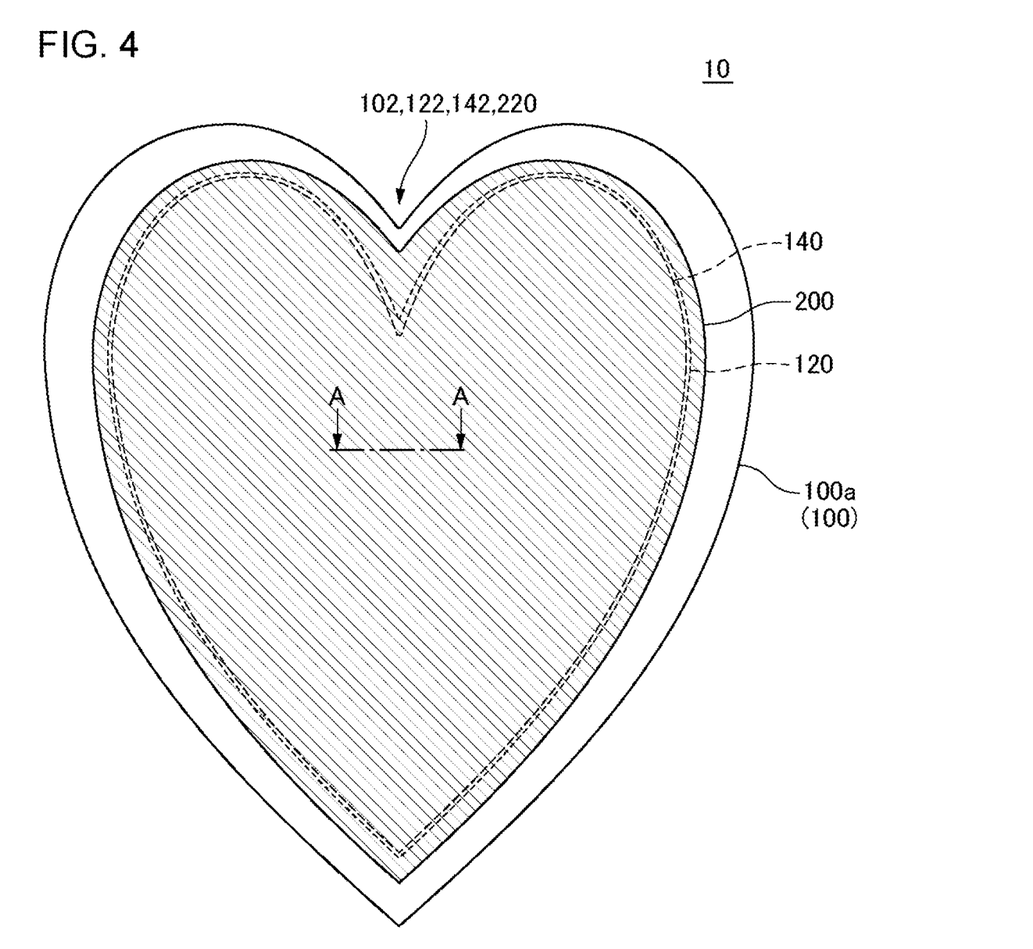
FIG. 4 is a plan view of a configuration of a light-emitting device according to Example 1.

FIG. 4 is a plan view of a configuration of a light-emitting device 10 according to Example 1. The light-emitting device 10 is, for example, a display lighting device, or a segment type display device, and includes a light-emitting unit 140. The light-emitting unit 140 includes an organic EL element, and is formed on a first surface 100a of a substrate 100. The light-emitting unit 140 is sealed using a sealing member 200. The substrate 100 includes a corner 102 including a central angle that is larger than 180 degrees. Further, the light-emitting unit 140 includes a corner 142 along the corner 102, and the sealing member 200 also includes a corner 220 along the corner 102.

Figure 5:
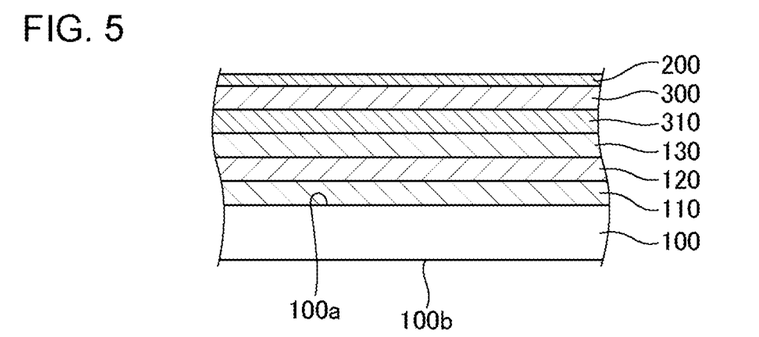
FIG. 5 is a cross-sectional view taken along line A-A of FIG. 4.

FIG. 5 is a cross-sectional view taken along line A-A of FIG. 4. As described above, the light-emitting unit 140 is formed on the first surface 100a of the substrate 100. The light-emitting unit 140 is, for example, a bottom emission type, but may be a top emission type or a both-face light emission type.

The substrate 100 is formed of a light-transmitting material, for example, glass, a light-transmitting resin, or the like. The substrate 100 is polygonal, for example, rectangular or the like, but not limited thereto. The substrate 100 may have flexibility. In a case where the substrate 100 has flexibility, the thickness of the substrate 100 is, for example, equal to or greater than 10 μm and equal to or less than 1,000 μm. Particularly in a case where the substrate 100 including glass is provided with flexibility, the thickness of the substrate 100 is, for example, equal to or less than 200 μm. In a case where the substrate 100 formed of a resin material is provided with flexibility, for example, polyethylene naphthalate (PEN), polyether sulphone (PES), polyethylene terephthalate (PET), and polyimide can be used as a material of the substrate 100. Meanwhile, in a case where the substrate 100 is formed of a resin material, an inorganic barrier film of $SiN_x$, SiON or the like is preferably formed at least on a light-emitting surface (preferably, both surfaces) of the substrate 100 in order to prevent moisture from permeating the substrate 100.

Meanwhile, in a case where the light-emitting unit 140 is a top-emission type, the substrate 100 need not have light-transmitting properties.

The light-emitting unit 140 includes a first electrode 110, an organic layer 120, and a second electrode 130. A case where the light-emitting unit 140 is a bottom-emission type, that is, a case where a light-emitting surface of the light-emitting device 10 is a second surface 100b will be described below.

The first electrode 110 is formed of a transparent conductive film. This transparent conductive film is a material containing a metal, for example, a metal oxide formed of an indium tin oxide (ITO), an indium zinc oxide (IZO), an indium tungsten zinc oxide (IWZO), a zinc oxide (ZnO), or the like. The refractive index of the material of the transparent electrode is, for example, equal to or greater than 1.5 and equal to or less than 2.2. The thickness of the transparent electrode is, for example, equal to or greater than 10 nm and equal to or less than 500 nm. The transparent electrode is formed by, for example, sputtering or vapor deposition. Meanwhile, the transparent electrode may be a conductive organic material such as carbon nanotubes or PEDOT/PSS or the like, or may be a thin metal electrode.

The organic layer 120 is located between the first electrode 110 and the second electrode 130, and includes a hole injection layer, a hole transport layer, a light-emitting layer, an electron transport layer, and an electron injection layer. However, the organic layer 120 may include at least the light-emitting layer, and the hole injection layer, the hole transport layer, the electron transport layer, and the electron injection layer need not be formed therein. The organic layer 120 may further include another layer. The organic layer 120 is formed by, for example, vapor deposition, but at least a portion of the layers may be formed by a coating method.

The second electrode 130 includes, for example, a metal layer, and does not have light-transmitting properties. The metal layer included in the second electrode 130 is a layer composed of a metal selected from a first group including, for example, Al, Au, Ag, Pt, Mg, Sn, Zn, and In, or a layer composed of an alloy of metals selected from the first group.

The sealing member 200 is fixed over the first surface 100a side of the substrate 100 (for example, on an upper surface of the second electrode 130) through, for example, a hygroscopic layer 300 and an adhesive layer 310. The hygroscopic layer 300 is a film containing a hygroscopic agent. The hygroscopic layer 300 is also formed into the same shape as that of the sealing member 200 but a little smaller than the sealing member in advance. However, the hygroscopic layer 300 need not be included. In such a case, the sealing member 200 is fixed over the first surface 100a side (for example, on the upper surface of the second electrode 130) through the adhesive layer 310. In addition, the inorganic sealing film (for example, $SiN_x$, SiON) may be formed between the adhesive layer 310 and the first surface 100a side (for example, the upper surface of the second electrode 130).

Meanwhile, the organic layer 120 may extend to the outside of the light-emitting unit 140. In this case, as shown in FIG. 4, the visible outline of the organic layer 120 is along, for example, the corner 142 in the vicinity of the corner 142 of the light-emitting unit 140. However, the visible outline of the organic layer 120 is not limited thereto.

The visible outline of the organic layer 120 may be either steeper than or more gradual than the line along the corner 142.

Figure 6:
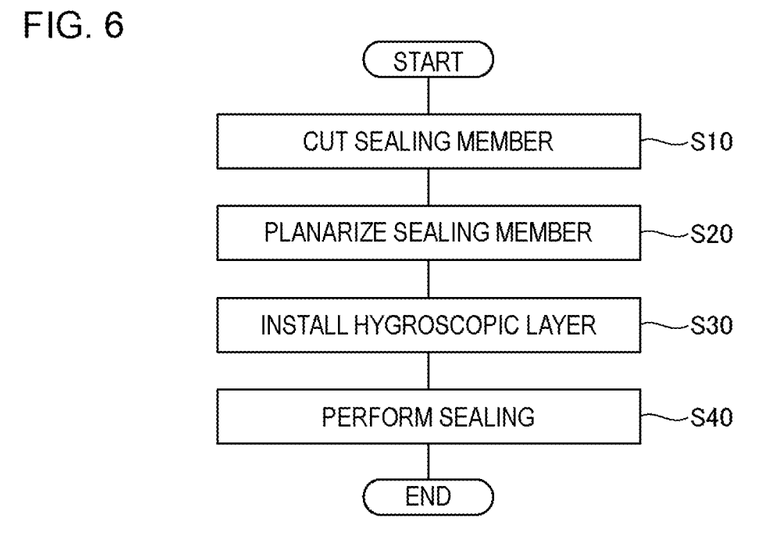
FIG. 6 is a flowchart explaining a method for manufacturing a light-emitting device.

FIG. 6 is a flowchart explaining a method of manufacturing the light-emitting device 10. First, the light-emitting unit 140 is formed in the light-emitting device 10.

Specifically, first, the substrate 100 of a desired shape is prepared. In this state, the shape of the substrate 100 may be as shown in FIG. 4 or a little larger. In a case where the substrate 100 is a resin substrate, the substrate 100 may be machined into a desired shape by the methods shown in the embodiment. Then, the first electrode 110 is formed on the substrate 100 by, for example, sputtering and photolithography. Thereafter, the organic layer 120 is formed. Next, the second electrode 130 is formed by, for example, vacuum deposition using a mask. Thereby, the light-emitting unit 140 is formed on the substrate 100.

In addition, separately from the formation of the light-emitting unit 140, the sealing member 200 is cut in a predetermined shape using a method shown in the embodiment (S10). Next, the sealing member 200 is planarized at least in the vicinity of the edge thereof using, for example, a roller or a stamper (S20). Thereby, a warp or deformation formed in a region 222 of the corner 220 is planarized and the height thereof becomes, for example, equal to or greater than 90% and equal to or less than 110% of the largest height of irregularities in a region 224 adjacent to the region 222 at the inner side thereof and having the same width as that of the region 222.

Next, the hygroscopic layer 300 having a predetermined shape is prepared. Methods shown in the embodiment may be used to machine the hygroscopic layer 300 into the predetermined shape. The hygroscopic layer 300 is installed to the sealing member 200 (S30), and further, the sealing member 200 is fixed on the first surface 100a side of the substrate 100 using the adhesive layer 310. Thus, the light-emitting unit 140 is sealed by the sealing member 200 (S40). In addition, in a case where the substrate 100 is larger than the shape shown in FIG. 4, the substrate 100 is machined into the shape shown in FIG. 4.

According to the present example, as shown in the embodiment, the curvature radius R of the corner 220 of the sealing member 200 is equal to or greater than the width w shown in FIG. 2. Therefore, irregularities can be inhibited from occurring in the corner 220, and as a result, sealability of the sealing member 200 can be inhibited from being deteriorated. In addition, after cutting the sealing member 200 into a predetermined shape, at least the edge of the sealing member 200 is planarized using a roller or the like. Therefore, sealability of the sealing member 200 can be further inhibited from deteriorating.

EXAMPLE 2

Figure 7:
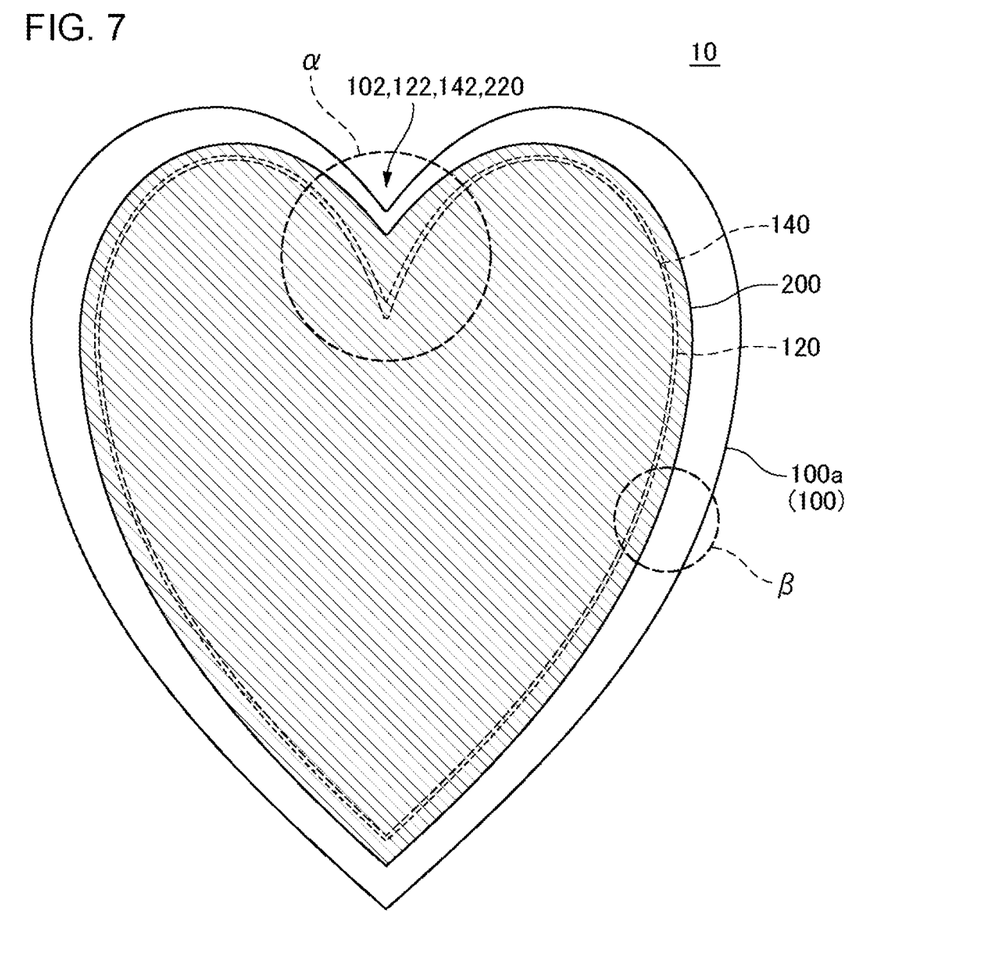
FIG. 7 is a plan view of a configuration of a light-emitting device according to Example 2.
Figure 8:
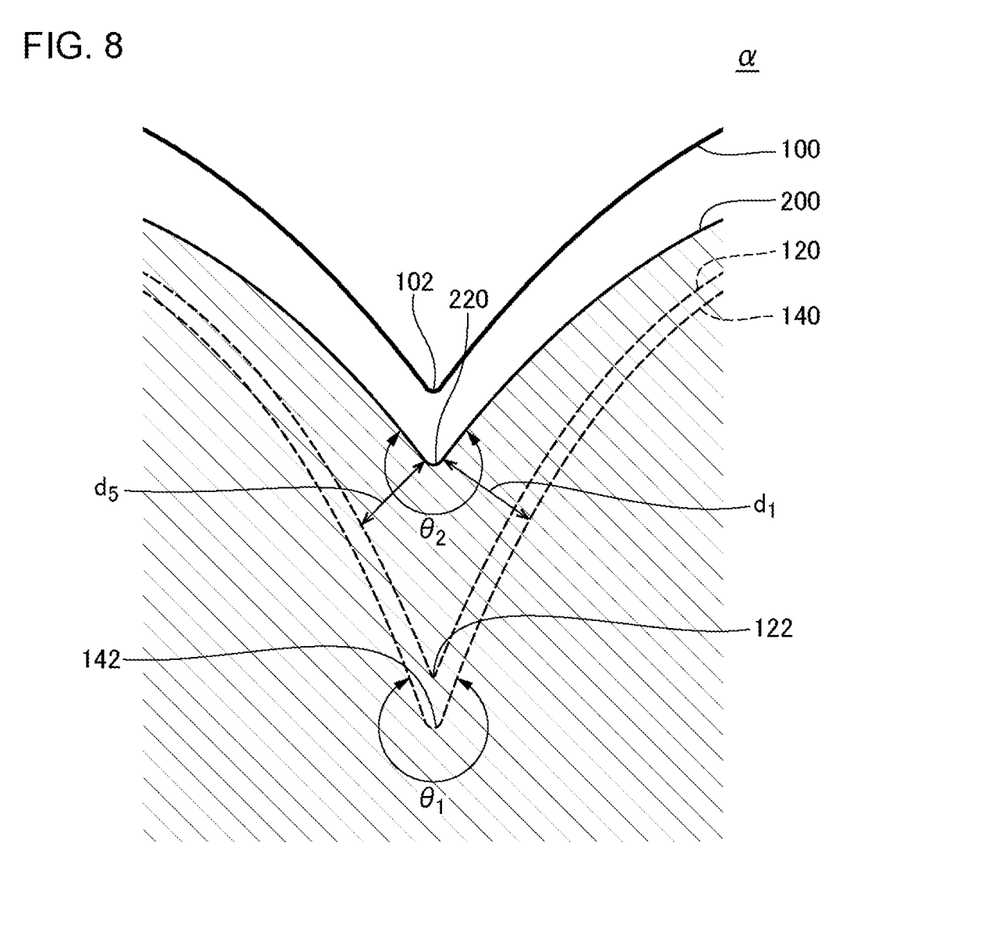
FIG. 8 is an enlarged view of a region of FIG. 7 surrounded by a dotted line α.
Figure 9:
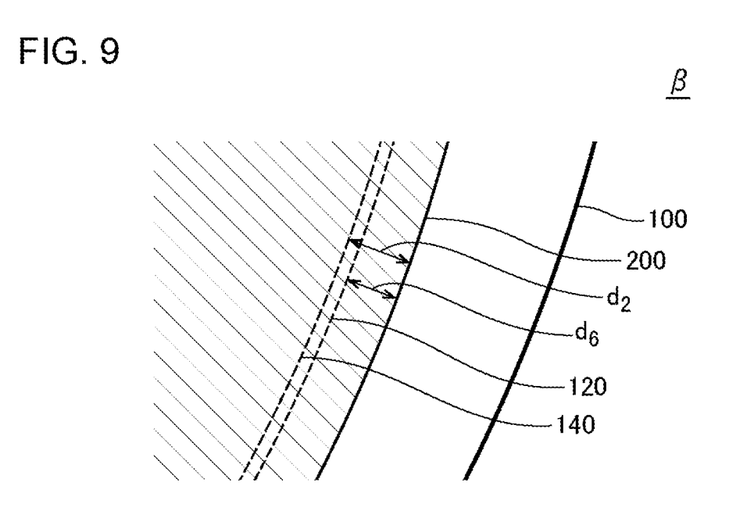
FIG. 9 is an enlarged view of a region of FIG. 7 surrounded by a dotted line β.

FIG. 7 is a plan view of a configuration of a light-emitting device 10 according to Example 2, and corresponds to FIG. 4 in Example 1. FIG. 8 is an enlarged view of a region of FIG. 7 surrounded by a dotted line α, and FIG. 9 is an enlarged view of a region of FIG. 7 surrounded by a dotted line β. The light-emitting device 10 according to the present example is the same as the light-emitting device 10 according to Example 1 except the following.

First, the distance from an edge of a light-emitting unit 140 to an edge of a sealing member 200 is not constant. In more detail, the shortest distance from a corner 142 of the light-emitting unit 140 to the sealing member 200, that is, the smallest sealing width $d_1$ at the corner 142 (see FIG. 8)

is greater than the smallest sealing width $d_2$ (see FIG. 9) out of widths from the edge of the sealing member 200 to the light-emitting unit 140. In other words, the smallest value of the distance from the light-emitting unit 140 to the edge of the sealing member 200 is not the smallest sealing width $d_1$ at the corner 142, and the sealing width at the corner 142 is wider than other portions of the light-emitting unit 140. By adopting such a configuration, since it takes time for moisture from the outside to reach the light-emitting unit in a portion where the sealing width is wide, even when deformation of the sealing member 200 occurs in the vicinity of the corner 142, substantial deterioration in sealability can be inhibited.

In addition, a central angle $\theta_1$ of the corner 142 of the light-emitting unit 140 (see FIG. 8) is greater than a central angle $\theta_2$ of a corner 220 of the sealing member 200 (see FIG. 8) ($\theta_1 > \theta_2$). The larger the central angle is, more conspicuous the deformation of the sealing member 200 becomes at the corner having a central angle that is larger than 180 degrees. Therefore, the deformation of the sealing member 200 during machining is inhibited by making the central angle $\theta_2$ of the corner 220 of the sealing member 200 small, and as a result, sealability of the sealing member 200 can be further inhibited from deteriorating in the vicinity of the corner 142.

Further, in a case where the organic layer 120 extends to the outside of the light-emitting unit 140, that is, an edge of the organic layer 120 is located between an edge of the light-emitting unit 140 and the edge of the sealing member 200, the shortest distance $d_5$ from a corner 122 of the organic layer 120 to the edge of the sealing member 200 (see FIG. 8) is desirably set greater than the shortest distance $d_6$ (see FIG. 9) from another portion of the organic layer 120 to the sealing member 200. In other words, the shortest distance $d_5$ from the corner 122 of the organic layer 120 to the edge of the sealing member 200 is greater than the shortest distance (sealing width) $d_6$ out of widths from the edge of the sealing member 200 to the organic layer 120.

Depending on the material of the organic layer 120, the diffusion rate of moisture in the organic layer 120 may be high. In such a case, it is preferable that moisture hardly reaches any portion of the organic layer 120. Therefore, a distance from the edge of the sealing member 200 to the organic layer 120 is preferably set greater than other distances in the vicinity of the corner 220 of the sealing member 200. By adopting such a configuration, even when sealability of the corner 220 is deteriorated, time for moisture to reach the organic layer 120 becomes longer in the vicinity of the corner 220 of the sealing member 200. Therefore, there is longer time before the performance of the light-emitting unit 140 starts deteriorating.

In the present example also, as is the case with Example 1, sealability of the sealing member 200 can be inhibited from deteriorating. That is, the smallest sealing width $d_1$ at the corner 142 is greater than the smallest sealing width $d_2$ out of widths from the edge of the sealing member 200 to the light-emitting unit 140. By adopting such a configuration, there is longer time until moisture is diffused to the light-emitting unit 140 in the vicinity of the corner 142, and substantial deteriorating in sealability can be inhibited. In addition, the central angle $\theta_2$ of the corner 220 of the sealing member 200 is smaller than the central angle $\theta_1$ of the corner 142 of the light-emitting unit 140. By adopting such a configuration, deformation of the corner 220 can be inhibited, and as a result, sealability of the corner can be further inhibited from deteriorating.

Meanwhile, in the present example also, as described in the embodiment, the curvature radius R of the corner 220 of the sealing member 200 is equal to or greater than the width w shown in FIG. 2. However, such a configuration need not be adopted in the present example. Instead, the smallest sealing width $d_1$ at the corner 142 may be greater than the smallest sealing width $d_2$ out of widths from the edge of the sealing member 200 to the light-emitting unit 140. Even with such a configuration, substantial deterioration in sealability can be inhibited in the vicinity of the corner 142. In addition, the central angle $\theta_1$ of the corner 142 of the light-emitting unit 140 may be larger than the central angle $\theta_2$ of the corner 220 of the sealing member 200. By adopting such a configuration, sealability can be further inhibited from deteriorating in the vicinity of the corner 142.

EXAMPLE 3

Figure 10:
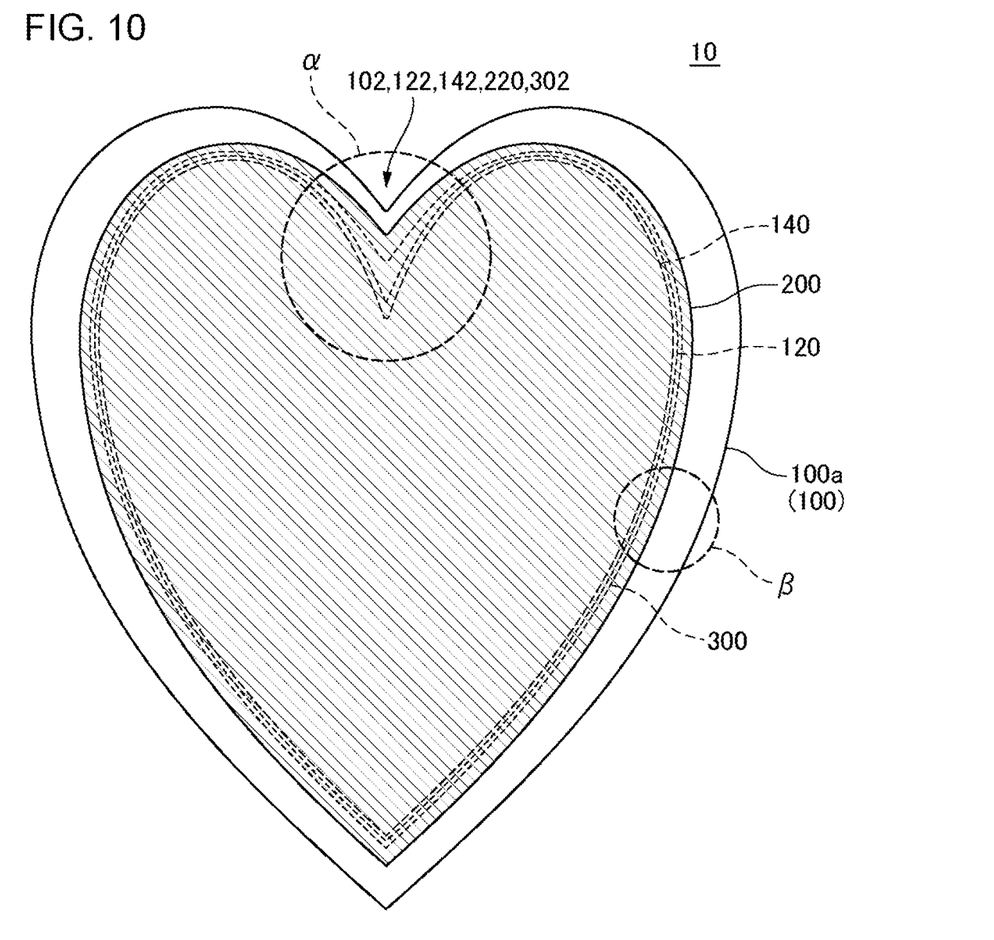
FIG. 10 is a plan view of a configuration of a light-emitting device according to Example 3.
Figure 11:
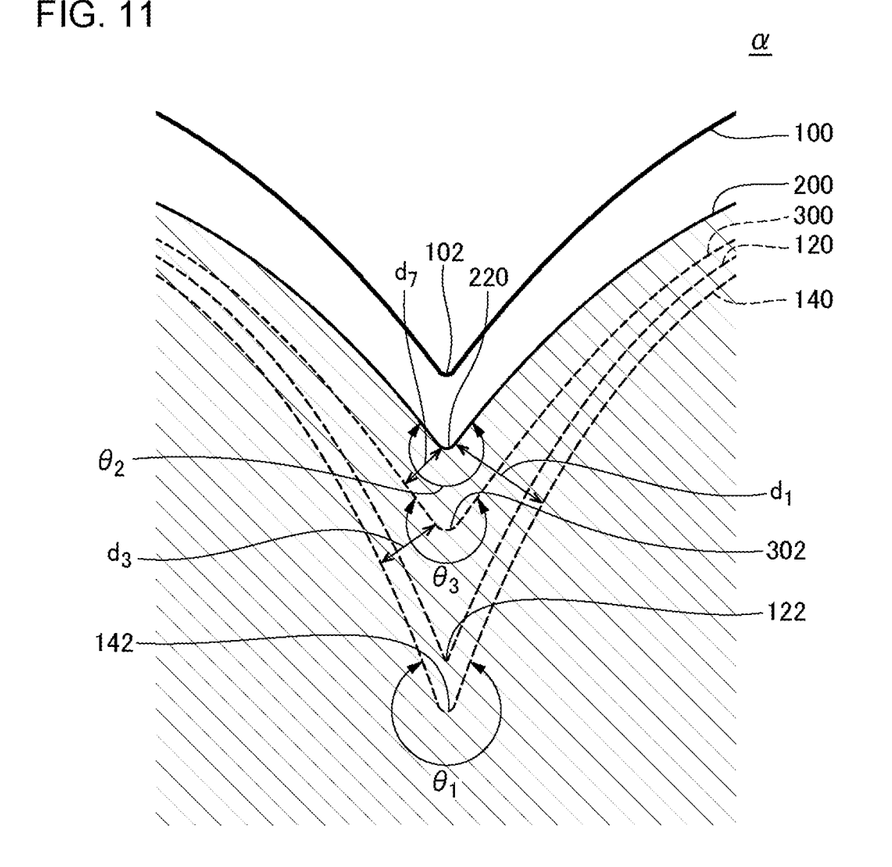
FIG. 11 is an enlarged view of a region of FIG. 10 surrounded by a dotted line α.
Figure 12:
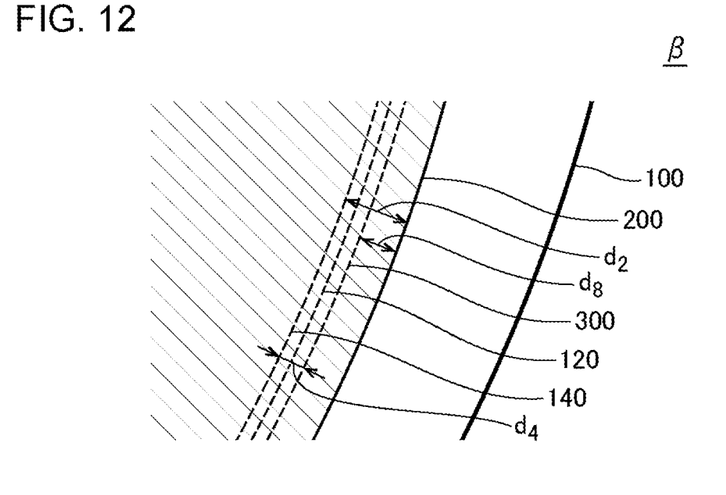
FIG. 12 is an enlarged view of a region of FIG. 10 surrounded by a dotted line β.

FIG. 10 is a plan view of a configuration of a light-emitting device 10 according to Example 3, and corresponds to FIG. 7 in Example 2. FIG. 11 is an enlarged view of a region of FIG. 10 surrounded by a dotted line α, and FIG. 12 is an enlarged view of a region of FIG. 10 surrounded by a dotted line β. In these drawings, a hygroscopic layer 300 is shown. The light-emitting device 10 according to the present example is the same as the light-emitting device 10 according to Example 2 except the following.

First, the distance from an edge of a light-emitting unit 140 to an edge of a sealing member 200 is not constant. In more detail, the shortest distance from a corner 142 of the light-emitting unit 140 to the sealing member 200, that is, the smallest sealing width $d_1$ at the corner 142 (see FIG. 11) is greater than the smallest sealing width $d_2$ (see FIG. 12) out of widths from the edge of the sealing member 200 to the light-emitting unit 140. In other words, the smallest value of the distance from the light-emitting unit 140 to the edge of the sealing member 200 is not the smallest sealing width $d_1$ at the corner 142.

In addition, the hygroscopic layer 300 is larger than the light-emitting unit 140. Therefore, an edge of the hygroscopic layer 300 is located between the edge of the light-emitting unit 140 and the edge of the sealing member 200. Further, the distance from the edge of the hygroscopic layer 300 to the edge of the light emitting unit 140 is not constant. In more detail, the shortest distance from the corner 302 of the hygroscopic layer 300 to the light-emitting unit 140, that is, the smallest protruding width $d_3$ of the hygroscopic layer 300 at the corner 302 (see FIG. 11) is greater than the smallest protruding width $d_4$ of the hygroscopic layer 300 out of widths from the edge of the hygroscopic layer 300 to the light-emitting unit 140 (see FIG. 12). In other words, the smallest value of the distance from the edge of the hygroscopic layer 300 to the light-emitting unit 140 is not the smallest protruding width $d_3$ at the corner 302. Therefore, the protruding width of the hygroscopic layer 300 is wider than other portions of the hygroscopic layer 300 at the corner 302.

According to the present example also, the same effect as that of Example 2 can be obtained. In the configuration of the present example, moisture diffuses through the adhesive layer 310 that fixes the sealing member 200, gradually diffusing through a portion overlapping the hygroscopic layer 300 along with the adsorption of moisture into the hygroscopic layer 300, thereafter reaching the organic layer 120, and then diffusing into the organic layer 120. As a result, moisture reaches the light-emitting unit 140 and causes a light-emission defect. At the portion overlapped with the hygroscopic layer 300, the diffusion speed is low since moisture diffuses while being adsorbed by the hygroscopic layer 300. Therefore, the distance from the edge of the hygroscopic layer 300 to the light-emitting unit 140 greatly contributes to prolonging the life of sealability. That is, the distance from the edge of the hygroscopic layer 300 to the light-emitting unit 140 contributes more to the life of sealability than the distance from the edge of the sealing member 200 to the edge of the hygroscopic layer 300. Therefore, the distance from the corner 302 of the hygroscopic layer 300 to the corner 142 of the light-emitting unit 140 is preferably longer compared to the other portion of the hygroscopic layer 300.

In the present example, the smallest protruding width $d_3$ of the hygroscopic layer 300 at the corner 302 is greater than the smallest protruding width $d_4$ of the hygroscopic layer 300 out of widths from the edge of the hygroscopic layer 300 to the light-emitting unit 140. By adopting such a configuration, even when the corner 220 is deformed and sealability is deteriorated, the time for moisture to reach the light-emitting unit 140 becomes longer in the vicinity of the corner 220 of the sealing member 200. Therefore, substantial deterioration in sealability can be inhibited.

In addition, the distance from the edge of the sealing member 200 to the hygroscopic layer 300 is also preferably set longer at the corner. That is, the shortest distance $d_7$ from the corner 220 of the sealing member 200 to the hygroscopic layer 300 (see FIG. 11) is greater than the smallest value $d_8$ of the distance from the edge of the sealing member 200 to the hygroscopic layer 300 (see FIG. 12). In other words, the smallest value $d_8$ of the distance from the edge of the sealing member 200 to the hygroscopic layer 300 is not the smallest value $d_7$ at the corner 302.

The greater the distance from the edge of the hygroscopic layer 300 to the edge of the sealing member 200 is, the longer the time necessary for moisture infiltrated from the outside to reach the edge of the hygroscopic layer 300 is. Further, the greater the distance from the edge of the hygroscopic layer 300 to the sealing member 200 is, the slower the speed becomes at which moisture advances thorough a portion where the adhesive layer 310 and the hygroscopic layer 300 overlap. That is, by making both of the distance from the edge of the sealing member 200 to the hygroscopic layer 300 and the distance from the edge of the hygroscopic layer 300 to the light-emitting unit 140 longer at the corner, even when the corner is deformed and sealability is deteriorated, the time it takes for moisture to reach the hygroscopic layer can be secured, and the moisture diffusion speed in the portion where the adhesive layer and the hygroscopic layer overlap can be slowed. In addition, the time it takes for moisture to diffuse from the edge of the hygroscopic layer to the light-emitting layer can be secured. Therefore, substantial deterioration in sealability can be further inhibited.

In addition, a central angle $\theta_3$ of the corner 302 of the hygroscopic layer 300 is equal to or greater than a central angle $\theta_2$ of the corner 220 of the sealing member 200 and smaller than the central angle $\theta_1$ of the corner 142 of the light-emitting unit 140 ($\theta_1 > \theta_3 \theta_2$). By adopting such a configuration, inevitably, the distance from the corner 220 of the sealing member 200 to the corner 302 of the hygroscopic layer 300 may be set longer, and the distance from the corner 302 of the hygroscopic layer 300 to the corner 142 of the light-emitting unit 140 may also be set longer. Therefore, substantial deterioration in sealability can be inhibited in the vicinity of the corner 142 of the light-emitting unit 140.

Meanwhile, in the structure of the present example, the advancing speed of moisture in the organic layer 120 is high, and moisture advancing in the portion where the adhesive layer 310 and the hygroscopic layer 300 overlap may advance into the organic layer 120 as soon as it reaches an edge of the organic layer 120. In this case, the greater the distance from the edge of the hygroscopic layer 300 to the edge of the organic layer 120 is, the higher the sealability becomes. Therefore, the distance from the corner 302 of the hygroscopic layer 300 to the corner 122 of the organic layer 120 is preferably set greater at the corner where sealability is easily deteriorated.

Meanwhile, in the present example, as described in the embodiment, a curvature radius R of the corner 220 of the sealing member 200 is equal to or greater than the width w shown in FIG. 2. However, such a configuration need not be adopted in the present example. Instead, the smallest protruding width $d_3$ from the edge of the hygroscopic layer 300 to the light-emitting unit 140 at the corner may be greater than the smallest protruding width $d_4$ from the edge of the hygroscopic layer 300 to the light-emitting unit 140. Even with such a configuration, substantial deterioration in sealability can be inhibited in the vicinity of the corner 142 of the light-emitting unit 140. In addition, a central angle $\theta_3$ of the corner 302 of the hygroscopic layer 300 may be larger than the central angle $\theta_2$ of the corner 220 of the sealing member 200 and equal to or greater than the central angle $\theta_1$ of the corner 142 of the light-emitting unit 140 ($\theta_1 \geq \theta_3 > \theta_2$). By adopting such a configuration, sealability can be further inhibited from deteriorating in the vicinity of the corner 142 of the light-emitting unit 140.

As described above, although the embodiment and examples of the present invention have been set forth with reference to the accompanying drawings, they are merely illustrative of the present invention, and various configurations other than those stated above can be adopted.

This application claims priority from Japanese Patent Application No. 2017-74711, filed Apr. 4, 2017, the disclosure of which is incorporated by reference in its entirety.

The invention claimed is:

1. A method for manufacturing a light-emitting device comprising:
   cutting a sealing member into a predetermined shape comprising a corner comprising a central angle that is larger than 180 degrees; and
   fixing the sealing member to a substrate after the step of cutting the sealing member,
   wherein in the step of cutting the sealing member,
      irregularities occur in a thickness direction in a first region comprising a predetermined width from an edge of the corner, and
      a curvature radius of the corner is set equal to or greater than the predetermined width.

2. The method for manufacturing a light-emitting device according to claim 1,
   wherein the sealing member comprises a metal film.

3. The method for manufacturing a light-emitting device according to claim 1, further comprising planarizing the irregularities after the step of cutting the sealing member.

4. The method for manufacturing a light-emitting device according to claim 3,
   wherein, after the step of planarizing the irregularities, a largest height of the irregularities of the corner is equal to or greater than 90% and equal to or less than 110% of a largest height of irregularities in a region of the sealing member that is adjacent to the first region at an inner side thereof and comprising a width that is the same as a width of the first region.

5. A method for manufacturing the sealing member according to claim 1, wherein the step of cutting the sealing member further comprises punching the sealing member with a cutting blade.

6. A light-emitting device comprising:
a substrate;
an organic EL element formed over the substrate, the organic EL element comprising a predetermined first shape comprising a first corner comprising a first central angle that is larger than 180 degrees; and
a sealing member sealing the organic EL element, the sealing member comprising a predetermined second shape comprising a second corner comprising a second central angle that is larger than 180 degrees;
wherein an area of the substrate is larger than an area of the sealing member as viewed in a direction perpendicular to the substrate,
wherein the sealing member comprises irregularities in a thickness direction in a region comprising a predetermined width from an edge of the second corner, and
wherein a curvature radius of the second corner being equal to or greater than the predetermined width.

7. A light-emitting device comprising:
a substrate;
an organic EL element formed over the substrate, the organic EL element comprising a predetermined first shape comprising a first corner comprising a first central angle that is larger than 180 degrees; and
a sealing member sealing the organic EL element, the sealing member comprising a predetermined second shape comprising a second corner comprising a second central angle that is larger than 180 degrees,
wherein an area of the substrate is larger than an area of the sealing member as viewed in a direction perpendicular to the substrate
wherein a curvature radius of the second corner is equal to or greater than 100 µm.

8. The light-emitting device according to claim 6,
wherein the organic EL element comprises a light-emitting unit, and
wherein a smallest sealing width $d_1$ from the corner of the sealing member to the light-emitting unit is greater than a smallest sealing width $d_2$ out of widths from an edge of the sealing member to the light-emitting unit.

9. The light-emitting device according to claim 8,
wherein a central angle $\theta_1$ of the light-emitting unit is larger than a central angle $\theta_2$ of the corner of the sealing member.

10. The light-emitting device according to claim 8, further comprising a hygroscopic layer located between the light-emitting unit and the sealing member,
wherein the hygroscopic layer comprises a corner of the hygroscopic layer at a location corresponding to the corner of the sealing member, and
wherein a smallest sealing width $d_3$ from the corner of the hygroscopic layer to the light-emitting unit is greater than a smallest sealing width $d_4$ out of widths from an edge of the hygroscopic layer to the light-emitting unit.

11. The light-emitting device according to claim 10,
wherein, when the central angle of the light-emitting unit is $\theta_1$, the central angle of the corner of the sealing member is $\theta_2$, and a central angle of the corner of the hygroscopic layer is $\theta_3$, a relation among each of the central angles is $\theta_1 > \theta_3 \geq \theta_2$.

12. The light-emitting device according to claim 7,
wherein the organic EL element comprises a light-emitting unit, and
wherein a smallest sealing width $d_1$ from the corner of the sealing member to the light-emitting unit is greater than a smallest sealing width $d_2$ out of widths from an edge of the sealing member to the light-emitting unit.

13. The light-emitting device according to claim 12,
wherein a central angle $\theta_1$ of the light-emitting unit is larger than a central angle $\theta_2$ of the corner of the sealing member.

14. The light-emitting device according to claim 12, further comprising a hygroscopic layer located between the light-emitting unit and the sealing member,
wherein the hygroscopic layer comprises a corner of the hygroscopic layer at a location corresponding to the corner of the sealing member, and
wherein a smallest sealing width $d_3$ from the corner of the hygroscopic layer to the light-emitting unit is greater than a smallest sealing width $d_4$ out of widths from an edge of the hygroscopic layer to the light-emitting unit.

15. The light-emitting device according to claim 14,
wherein, when the central angle of the light-emitting unit is $\theta_1$, the central angle of the corner of the sealing member is $\theta_2$, and a central angle of the corner of the hygroscopic layer is $\theta_3$, a relation among each of the central angles is $\theta 1 > \theta 3 \geq \theta 2$.

16. A method for manufacturing a light-emitting device comprising:
preparing a sheet-like sealing member used in the light-emitting device;
cutting the sealing member into a predetermined shape comprising a corner comprising a central angle that is larger than 180 degrees,
wherein in the step of cutting the sealing member,
irregularities occur in a thickness direction in a first region comprising a predetermined width from an edge of the corner, and
a curvature radius of the corner is set equal to or greater than the predetermined width; and
planarizing the irregularities after the step of cutting the sealing member.

17. A light-emitting device comprising:
an organic EL element; and
a sealing member sealing the organic EL element,
wherein the sealing member comprises:
a predetermined shape comprising a corner comprising a central angle that is larger than 180 degrees; and
irregularities in a thickness direction in a region comprising a predetermined width from an edge of the corner,
a curvature radius of the corner being equal to or greater than the predetermined width,
wherein the organic EL element comprises a light-emitting unit, and
wherein a smallest sealing width $d_1$ from the corner of the sealing member to the light-emitting unit is greater than a smallest sealing width $d_2$ out of widths from an edge of the sealing member to the light-emitting unit.

18. The light-emitting device according to claim 17,
wherein a central angle $\theta_1$ of the light-emitting unit is larger than a central angle $\theta_2$ of the corner of the sealing member.

19. The light-emitting device according to claim 17, further comprising a hygroscopic layer located between the light-emitting unit and the sealing member,
wherein the hygroscopic layer comprises a corner of the hygroscopic layer at a location corresponding to the corner of the sealing member, and wherein a smallest sealing width $d_3$ from the corner of the hygroscopic layer to the light-emitting unit is greater than a smallest sealing width $d_4$ out of widths from an edge of the hygroscopic layer to the light-emitting unit.

20. The light-emitting device according to claim 19, wherein, when the central angle of the light-emitting unit is $\theta_1$, the central angle of the corner of the sealing member is $\theta_2$, and a central angle of the corner of the hygroscopic layer is $\theta_3$, a relation among each of the central angles is $\theta_1 > \theta_3 \geq \theta_2$.

* * * * *